United States Patent [19]
Ben Sadou et al.

[11] 4,204,172
[45] May 20, 1980

[54] AUTOMATIC GAIN CONTROL DEVICE FOR A SINGLE-SIDEBAND RECEIVER

[75] Inventors: Jean-Claude Ben Sadou; Pierre Deman, both of Paris, France

[73] Assignee: Thomson-CSF, Paris, France

[21] Appl. No.: 952,954

[22] Filed: Oct. 20, 1978

[30] Foreign Application Priority Data
Oct. 25, 1977 [FR] France .................. 77 32051

[51] Int. Cl.² .................................. H03G 3/20
[52] U.S. Cl. ............................. 330/134; 330/138; 455/234; 330/141
[58] Field of Search ............. 330/134, 138, 141, 279, 330/280, 281, 284; 325/402, 403, 404, 478; 179/1 VC

[56] References Cited

U.S. PATENT DOCUMENTS
4,112,384  9/1978  Buchberger .................. 330/284 X

FOREIGN PATENT DOCUMENTS
1094357  12/1967  United Kingdom .................. 179/1 VC

*Primary Examiner*—James B. Mullins
*Attorney, Agent, or Firm*—Cushman, Darby & Cushman

[57] ABSTRACT

A circuit determines whether the signal transmitted by a variable-gain amplifier comprises information or not. If it comprises information, its level is regulated, by comparison with a first reference signal, in order to give a predetermined correct listening level at the output of the receiver. If it does not comprise any, its level is regulated, by comparison with a second reference signal, in order to give at the output of the receiver the listening level corresponding to the hearing threshold.

5 Claims, 1 Drawing Figure

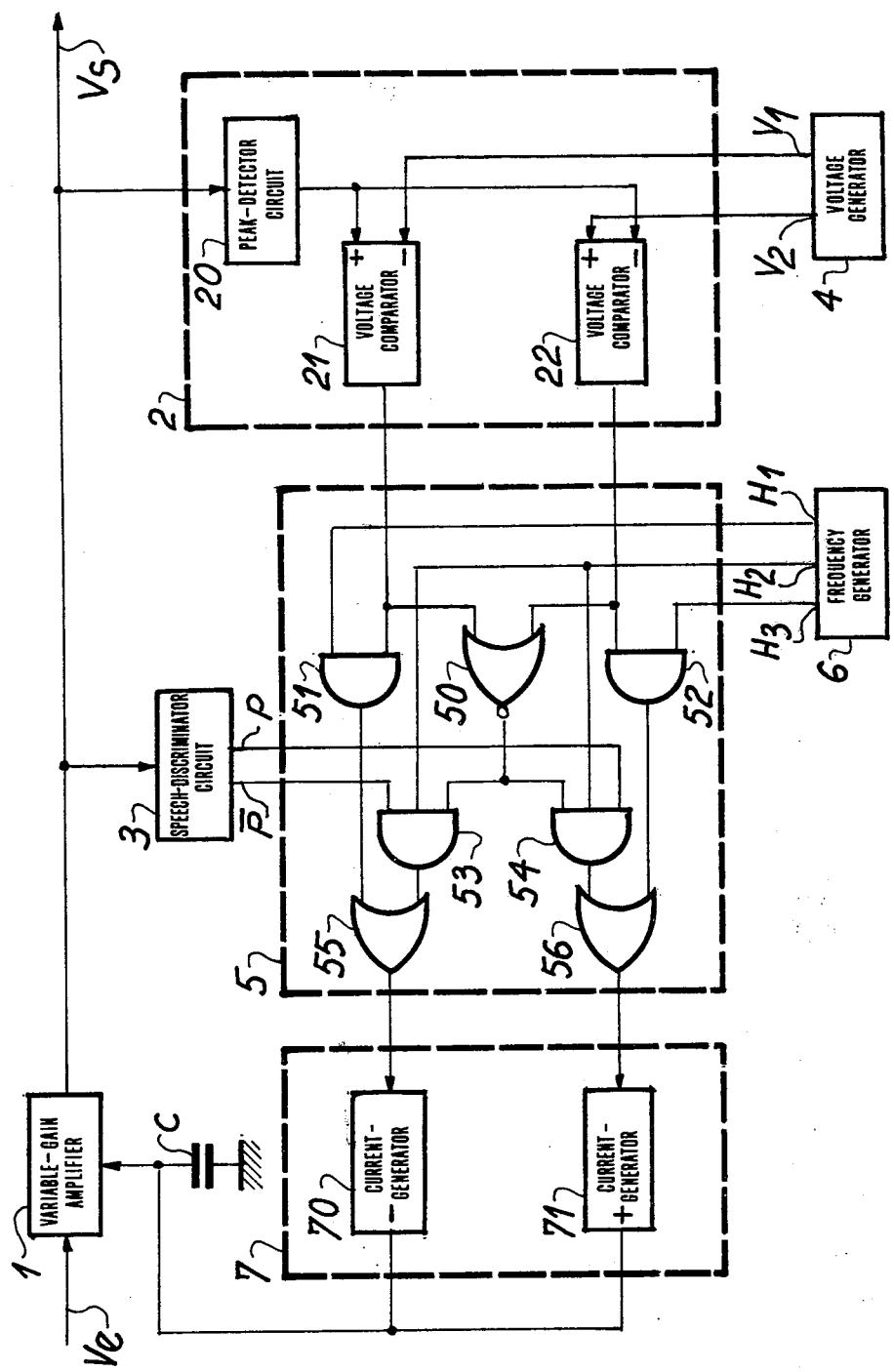

AUTOMATIC GAIN CONTROL DEVICE FOR A SINGLE-SIDEBAND RECEIVER

The present invention relates to an automatic gain control device for a single-sideband receiver comprising at least one variable-gain amplifier, a discriminator circuit for determining whether any information is present in the signal received by the receiver and a control circuit, coupled to the discriminator circuit, for regulating the output level of the variable-gain amplifier.

Devices of this type are known, in particular in receivers in which the information consists of speech; these devices make it possible on the one hand to regulate the variable-gain amplification to a value corresponding to a constant listening level from the s.s.b. receiver, and on the other hand to prevent the receiver from delivering a signal for listening when the discriminator circuit indicates that the received signal does not comprise any speech. However, since speech is not recognised without error by known discriminator circuits, this results in losses of speech in the signal and untimely increases in noise.

It is possible to manufacture such an automatic gain control device which is not attended by the aforementioned disadvantages but which, at the same time, retains the aforementioned advantages.

This is done by regulating the output level of the variable-gain amplifier so as to bring the output signal of the s.s.b. receiver towards the normal level of hearing when the signal contains information, and towards the threshold of hearing when it contains only noise.

According to the invention, an automatic gain control device for a single-sideband receiver, comprising at least one variable-gain amplifier having an output, a discriminator circuit for delivering a first or a second signal according to whether information is present or not in a signal received by said receiver, and a control circuit, coupled to said discriminator circuit, said control circuit comprising controlling means for bringing the output level of said variable-gain amplifier to a value $V_a$ or $V_b$, according to whether said first or second signal is present, $V_a$ and $V_b$ being two different values of said output level enabling said receiver to be heard.

The invention will be better understood, and other features will appear, with the aid of the following description and the FIGURE relating thereto, which illustrates a control device according to the invention.

The FIGURE illustrates a variable-gain amplifier 1 of a high-frequency s.s.b. receiver. The amplifier receives a low-frequency signal $V_e$ and delivers a signal $V_s$ whereof the signal-to-noise ratio will by hypothesis be at least 10 dB for correct transmission. The amplifier 1 comprises a control input to which are connected: the first terminal of a condenser C whereof the second terminal goes to earth, and the output of a negative-current generator 70 and of a positive-current generator 71; these current-generators are respectively intended to enable the condenser C to be discharged and charged, and constitute the current-generator circuit 7 of the device of the FIGURE.

The signal $V_s$ is the output signal of the device of the FIGURE; this is the signal which, after amplification, gives the listening signal of the receiver.

The signal $V_s$ is also used in the device of the FIGURE as the input signal of a comparison circuit 2, and of a speech-discriminator circuit 3. The circuit 3 determines, with a certain risk of error which is inherent in circuits of this kind, whether the signal $V_s$ comprises speech or not; it delivers a signal P and a signal $\overline{P}$, respectively exhibiting the logic levels "1" and "0" in the case in which speech is detected in the signal $V_s$, and the logic levels "0" and "1" in the opposite case.

The comparison circuit 2 comprises a peak-detector circuit 20 and two voltage-comparators 21 and 22. The signal $V_s$ is applied via the circuit 20 to the "+" input of the comparator 21 and to the "−" input of the comparator 22. By its constitution, the circuit 20 introduces a delay of 1 ms into the transmission, with respect to its output signal, of the variations in the peak value of its input signal $V_s$.

A voltage-generator 4 delivers two d.c. reference voltages $V_1$ and $V_2$, which are applied to the "−" input of the comparator 21 and to the "+ −" input of the comparator 22 respectively; the values of the voltages $V_1$ and $V_2$ are those assumed by the output signal of the peak-detector circuit 20 when the level of the signal $V_s$ is respectively the predetermined listening level considered as normal (which will be by convention a level of 0 dB) and the level of the threshold of hearing, situated NdB below the normal listening level; in the example described, N is taken as equal to 20.

The output signals of the comparators 21 and 22 are applied to a group of logic circuits 5, which receives in addition the signals P and $\overline{P}$ worked out by the speech-discriminator circuit 3 and the signals $H_1$, $H_2$ and $H_3$ formed from periodic pulses supplied respectively by the three outputs of a frequency-generator 6.

The group of logic circuits 5 is intended to supply the current-generators 70 and 71 in non-simultaneous manner with pulses during which these generators will respectively be able to charge or discharge the condenser C. The time required to charge or discharge the condenser, which will for simplicity be called the "charge (or discharge) time constant" is a function of the value of this condenser, of the output impedance of the current-generator which supplies a charging or discharging current for the condenser, and of the width and frequency of the pulses which control the operation of the current-generators 70, 71; it is by varying the frequency of the pulses which it supplies to the current-generators 70 and 71 that the group of logic circuits will vary the charging time constant of the condenser C; the reasons for these variations will be explained hereinafter.

The automatic gain control devices of the FIGURE is provided in order to:
  return the level of the signal $V_s$ very rapidly to 0 dB when it exceeds this value; this makes it possible to avoid disagreeable listening, due to too much sound power inside the output headphone of the receiver,
  make the level of $V_s$ approach normal listening level when the speech-discriminator circuit determines that speech is present, and that the level of the signal $V_s$ is lower than 0 dB,
  make the level of $V_s$ approach the threshold of hearing when the discriminator circuit does not determine that any speech is present in the signal $V_s$, or when the level of the signal $V_s$ is lower than −NdB; on the one hand this avoids any annoyance, during the absence of a speech signal, by a high-level (0 dB) noise signal, and on the other hand it enables the speech signal to be heard if the speech-discriminator circuit gives an erroneous result (signal P=0 when the signal $V_s$ contains speech), arrange that if the level of the signal $V_s$ is between 0 and $-$NdB the approach to the levels of 0 dB or $-$NdB shall not be too rapid should the speech-discriminator circuit give an erroneous result for a short time, so that this erroneous result shall involve only slight disadvantages; in fact, at the instant when the result is again correct the gain of the amplifier has not had time to vary appreciably, arrange that the noise level rises slowly when the level of the signal $V_s$ is lower than $-$NdB; in fact, the signal $V_s$ is practically unable to exhibit a level lower than $-$NdB except when it comprises no speech signal and when the signal-to-noise ratio of the transmission is very good (greater than 20 dB), and there is therefore no advantage in this case in rapidly increasing the gain of the variable-gain amplifier, since when the speech signal appears its level will be too high (greater than 0 dB).

In order to obtain these objectives, the group of logic circuits 5 comprises:

two AND gates 51 and 52 which respectively receive at one of their two inputs the signals $H_1$ and $H_3$, and at their other input the output signals of the comparators 21 and 22, an inverting OR gate 50 which receives the output signals of the comparators 21 and 22, two AND gates 53 and 54 receiving at their first input the output signal of the inverting OR gate 50, at their second input the signal $H_2$, and at their third input the signals $\overline{P}$ and P respectively, two OR gates 55 and 56 which receive at their first input the output signals of the gates 51 and 52 respectively, and at their second input the output signals of the gates 53 and 54 respectively; the output signals of the gates 55 and 56 respectively constitute the control signals for the current-generators 70 and 71.

Thus when the signal $V_s$ has a level greater than 0 dB (that is to say when the output voltage of the peak-detector circuit 20 is greater than the voltage $V_1$ supplied by the generator 4) the comparator 21 supplies a logic level "1" which enables the signal $H_1$ to be sent via the AND gate 51 and the OR gate 55. The frequency of the pulses in this signal $H_1$ is so adjusted that the negative current-generator 70 discharges the condenser C with a short time constant $\tau_1$ of the order of 3 ms; the result of this is that the signal $V_s$ rapidly approaches 0 dB.

When the signal $V_s$ has a level of between 0 and $-$NdB, and the signal $\overline{P}$ from the circuit 3 represents the logic level "1" (speech signal detected in the signal $V_s$), the AND gate 54 allows the signal $H_2$ to pass, and this signal will control the positive current-generator 71 via the OR gate 56. The frequency of the pulses in this signal $H_2$ is so adjusted that the generator 71 charges the condenser C with a mean time constant $\tau_2$ of 30 ms; this results in $V_s$ approaching the level of 0 dB with this time constant $\tau_2$.

When the signal $V_s$ has a level of between 0 and $-$NdB, but the signal P from the circuit 3 exhibits the logic level "1" (no speech signal detected in the signal $V_s$), the signal $H_2$ passes through the gates 53 and 55; this results in the negative current-generator 70 being so controlled that the condenser C discharges and causes the level of the signal $V_s$ to approach $-$NdB with the same time constant $\tau_2$ as before, given that in the example being described the current-generators 70 and 71 have the same output impedance.

And when the signal $V_s$ has a level lower than $-$NdB the comparator 22 supplies a logic level "1" which enables the signal $H_3$ to be sent via the AND gate 52 and the OR gate 56 to the control input of the positive current-generator 71. The frequency of the pulses in the signal $H_3$ is so adjusted that the current-generator 71 charges the condenser C in such a manner as to cause the level of $V_s$ to approach $-$NdB with a time constant $\tau_3$ of 100 ms.

Other automatic gain control devices for a s.s.b. receiver may be envisaged within the scope of the invention. Thus for example when the level of the voltage $V_s$ is between 0 and $-$NdB the time constant in order to bring it to 0 dB may be different from the time constant in order to bring it to $-$NdB. Likewise, the time constants which have been discussed were obtained by virtue of signals formed from pulses whereof the frequency was chosen as a function of these time constants; this could be replaced by a group of resistances capable of being switched over and intended to alter the output impedance of the current-generators 70 and 71, the change-over of these resistances being controlled for example with the aid of the output signals of the comparators 21 and 22 and the inverting OR gate 50.

The signal $V_e$ of the FIGURE is a low-frequency signal; it should be noted that this signal could be an intermediate-frequency signal, in which case the circuit 1 would be made up of a group of amplifiers and frequency-changer circuits, and the control signal, taken off across the terminals of the condenser C, would control the gain of all or some of these amplifiers.

It should be noted that the invention is more particularly applicable to s.s.b. h.f. receivers because of the problems of fading which affect the received signal.

Of course, the invention is not limited to the embodiment described and shown which was given soley by way of example.

What is claimed is:

1. An automatic gain control device for a single-sideband receiver, comprising:
at least one variable-gain amplifier having an output for producing an output signal, a discriminator circuit for delivering one of a first or a second signal according to whether or not speech is present in a signal received by said receiver,
detecting means coupled to said amplifier for producing one of a third or a fourth signal according to whether the level of said output signal is above a value $V_a$, $V_a$ being a predetermined value corresponding to a predetermined correct listening level of said receiver, or below a value $V_b$, $V_b$ being a predetermined value corresponding to a hearing threshold level of said receiver, and
a control circuit, coupled to said discriminator circuit and to said detection means, said control circuit comprising controlling means for bringing the output level of said variable-gain amplifier to said value $V_a$ with a first time constant value when said third signal is present, to said value $V_a$ with a second time constant value when said third and fourth signals are absent and said first signal is present simultaneously, to said value $V_b$ with a third time constant value when said third and fourth signals are absent and said second signal is present simultaneously, and to said value $V_b$ with a fourth time constant value whenever said fourth signal is present.

2. An automatic gain control device according to claim 1 wherein said first time constant value is of a few milliseconds.

3. An automatic gain control device according to claim 1, wherein said fourth time constant value is of the order of at least about a hundred milliseconds.

4. An automatic gain control device according to claim 1, wherein said second time constant value is of the order of a few tens of milliseconds.

5. An automatic gain control device according to claim 1, wherein said third time constant value is of the order of a few tens of milliseconds.

* * * * *